(12) United States Patent
Pan et al.

(10) Patent No.: US 11,551,905 B2
(45) Date of Patent: Jan. 10, 2023

(54) RESONANT PROCESS MONITOR

(71) Applicant: APPLIED MATERIALS, INC., Santa Clara, CA (US)

(72) Inventors: Yaoling Pan, Santa Clara, CA (US); Vijaykumar Krithivasan, San Jose, CA (US); Shimin Mao, Santa Clara, CA (US); Kelvin Chan, San Ramon, CA (US); Michael D. Willwerth, Campbell, CA (US); Anantha Subramani, Santa Clara, CA (US); Ashish Goel, Sunnyvale, CA (US); Chih-shun Lu, Los Altos, CA (US); Philip Allan Kraus, San Jose, CA (US); Patrick John Tae, Palo Alto, CA (US); Leonard Tedeschi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 692 days.

(21) Appl. No.: 15/925,739

(22) Filed: Mar. 19, 2018

(65) Prior Publication Data

US 2019/0287758 A1    Sep. 19, 2019

(51) Int. Cl.
*H01J 37/244* (2006.01)
*H01L 21/67* (2006.01)
(Continued)

(52) U.S. Cl.
CPC ...... *H01J 37/244* (2013.01); *H01J 37/32917* (2013.01); *H01L 21/67253* (2013.01);
(Continued)

(58) Field of Classification Search
CPC .......... G01N 2291/0426; G01N 29/022; H01J 37/244; H01J 37/32917; H01J 37/32642;
(Continued)

(56) References Cited

U.S. PATENT DOCUMENTS 2,842,687 A * 7/1958 Van Dyke ................ H03H 9/09
                                              310/345
5,455,475 A * 10/1995 Josse ...................... G01N 29/24
                                              310/322
(Continued)

OTHER PUBLICATIONS

Official Letter from Taiwan Patent Application No. 108109028 dated Sep. 12, 2022, 12 pgs.

*Primary Examiner* — Keath T Chen
*Assistant Examiner* — Margaret Klunk
(74) *Attorney, Agent, or Firm* — Schwabe, Williamson & Wyatt, P.C.

(57) ABSTRACT

Embodiments described herein include a resonant process monitor and methods of forming such a resonant process monitor. In an embodiment, the resonant process monitor includes a frame that has a first opening and a second opening. In an embodiment, a resonant body seals the first opening of the frame. In an embodiment, a first electrode on a first surface of the resonant body contacts the frame and a second electrode is on a second surface of the resonant body. Embodiments also include a back plate that seals the second opening of the frame. In an embodiment the back plate is mechanically coupled to the frame, and the resonant body, the back plate, and interior surfaces of the frame define a cavity.

20 Claims, 8 Drawing Sheets

(51) Int. Cl.
    *H01L 41/047*    (2006.01)
    *H01L 41/053*    (2006.01)
    *H01L 41/29*     (2013.01)
    *H01L 41/04*     (2006.01)
    *H01J 37/32*     (2006.01)
    *H01L 41/31*     (2013.01)

(52) U.S. Cl.
    CPC ........ *H01L 41/044* (2013.01); *H01L 41/0475* (2013.01); *H01L 41/0533* (2013.01); *H01L 41/0536* (2013.01); *H01L 41/29* (2013.01); *H01L 41/31* (2013.01); *H01J 37/32642* (2013.01); *H01J 2237/24592* (2013.01)

(58) Field of Classification Search
    CPC ..... H01J 2237/24592; H01L 21/67253; H01L 41/044; H01L 41/0475; H01L 41/0533; H01L 41/0536; H01L 41/29; H01L 41/31
    See application file for complete search history.

(56) References Cited

U.S. PATENT DOCUMENTS

| | | | | |
|---|---|---|---|---|
| 6,033,852 | A * | 3/2000 | Andle | G01N 29/036 310/311 |
| 6,140,740 | A * | 10/2000 | Porat | A61B 5/413 310/365 |
| 7,052,622 | B2 * | 5/2006 | Chinn | B81C 1/00476 216/58 |
| 9,978,621 | B1 * | 5/2018 | Kraus | H01J 37/32834 |
| 2004/0051595 | A1 * | 3/2004 | Yoshimine | H03B 5/32 331/158 |
| 2006/0171848 | A1 * | 8/2006 | Roche | H01J 37/32935 422/98 |
| 2006/0216406 | A1 * | 9/2006 | Hudson | H01J 37/32963 427/8 |
| 2006/0283249 | A1 * | 12/2006 | Liu | G01N 17/02 73/579 |
| 2009/0061542 | A1 * | 3/2009 | Patrick | G01N 17/04 438/10 |
| 2010/0052470 | A1 * | 3/2010 | Andle | H04R 17/00 310/313 A |
| 2011/0235056 | A1 * | 9/2011 | Matsudo | G01B 9/0209 356/630 |
| 2011/0266924 | A1 * | 11/2011 | Spencer, II | G01N 29/223 310/344 |
| 2012/0206545 | A1 * | 8/2012 | Kato | B41J 2/14233 347/70 |
| 2015/0323441 | A1 * | 11/2015 | Lachance | G01N 29/222 73/54.24 |
| 2017/0120242 | A1 * | 5/2017 | Rivas | G01N 29/222 |
| 2018/0003677 | A1 * | 1/2018 | Oster | B81B 3/0021 |
| 2018/0240692 | A1 * | 8/2018 | Kraus | H01L 21/67069 |

* cited by examiner

RESONANT PROCESS MONITOR

BACKGROUND

1) Field

Embodiments relate to the field of semiconductor manufacturing and, in particular, to resonant process monitors for use in monitoring chamber performance in real time.

2) Description of Related Art

In semiconductor manufacturing, chamber performance needs to be closely analyzed in order to ensure high yields, chamber matching, process uniformity, etc. Currently, chamber performance is determined by the output obtained from the chamber (i.e., the processed substrates are inspected to determine if the chamber is performing properly). Additionally, chambers may be taken off line for cleaning or calibration after a certain number of substrates are processed.

Semiconductor manufacturing tools may also include consumable products. For example, edge rings and process rings are generally consumable products that need to be replaced periodically. Since taking a tool offline for maintenance is expensive, it is important to know the useable lifespan of the consumable component. Replacing the consumable component too early results in increased down time. Replacing the consumable component too late results in poor chamber performance.

SUMMARY

Embodiments described herein include a resonant process monitor and methods of forming such a resonant process monitor. In an embodiment, the resonant process monitor includes a frame that has a first opening and a second opening. In an embodiment, a resonant body seals the first opening of the frame. In an embodiment, a first electrode on a first surface of the resonant body contacts the frame and a second electrode is on a second surface of the resonant body. Embodiments also include a back plate that seals the second opening of the frame. In an embodiment the back plate is mechanically coupled to the frame, and the resonant body, the back plate, and interior surfaces of the frame define a cavity.

Additional embodiments include a processing tool that includes a resonant process monitor. In an embodiment, the processing tool may include a chamber, a susceptor, and an edge ring around the susceptor. In an embodiment, the resonant process monitor may be integrated in a wall of the chamber or in the edge ring. In an embodiment, the resonant process monitor may include a frame that has a first opening and a second opening. In an embodiment, a resonant body seals the first opening of the frame. In an embodiment, a first electrode on a first surface of the resonant body contacts the frame and a second electrode is on a second surface of the resonant body. Embodiments also include a back plate that seals the second opening of the frame. In an embodiment the back plate is mechanically coupled to the frame, and the resonant body, the back plate, and interior surfaces of the frame define a cavity.

An additional embodiment includes a method of forming a resonant process monitor. In an embodiment, the method may include bringing a first electrode on a resonant body into contact with a frame. In an embodiment, the resonant body seals a first opening in the frame Embodiments may then continue with bringing a first end of a contact assembly into contact with a second electrode on the resonant body. In an embodiment a second end of the contact assembly is supported by a back plate. Thereafter, embodiments may include securing the back plate to the frame. In an embodiment, the back plate seals a second opening in the frame. In an embodiment, the resonant body, the back plate, and interior sidewalls of the frame define a cavity. Embodiments may then include forming a barrier layer over at least a portion of the first electrode.

DETAILED DESCRIPTION

Systems that include resonant process monitors and the use of resonant process monitors are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the performance of a chamber is a factor that contributes to many different process parameters. However, it is currently difficult to measure those parameters in real time. Accordingly, embodiments described herein include resonant process monitors for monitoring chamber performance and consumable product lifespans. In some embodiments, the resonant process monitors described herein may be used to monitor chamber performance in real time.

Particularly, embodiments described herein include a resonant process monitor that uses a resonant body. A change in the mass of the resonant body results in changes to the resonance frequency of a resonating body. As used herein a "change to the mass of the resonant body" may refer to changes to the mass of layers supported by the resonant body. For example, depositing a layer of material over the resonant body may be referred to herein as "increasing the mass of the resonant body", and etching a material layer supported by the resonant body may be referred to as "decreasing the mass of the resonant body", even though in both instances the resonant body itself may not change in mass.

In an embodiment, as the mass of the resonant body changes, the resonance frequency of the resonant body changes monotonically. For example, in an etching process a decrease in mass of layers supported by the resonant body causes an increase in the resonance frequency of the resonant body. The increase in resonance frequency may be measured in real time, and the rate of change of resonance frequency is converted to a rate of change of the mass of the layer supported by the resonant body. The rate of change of mass may then be converted to a rate of change of thickness of the layer supported by the resonant body since the density of the film material is known.

Figure 1A:
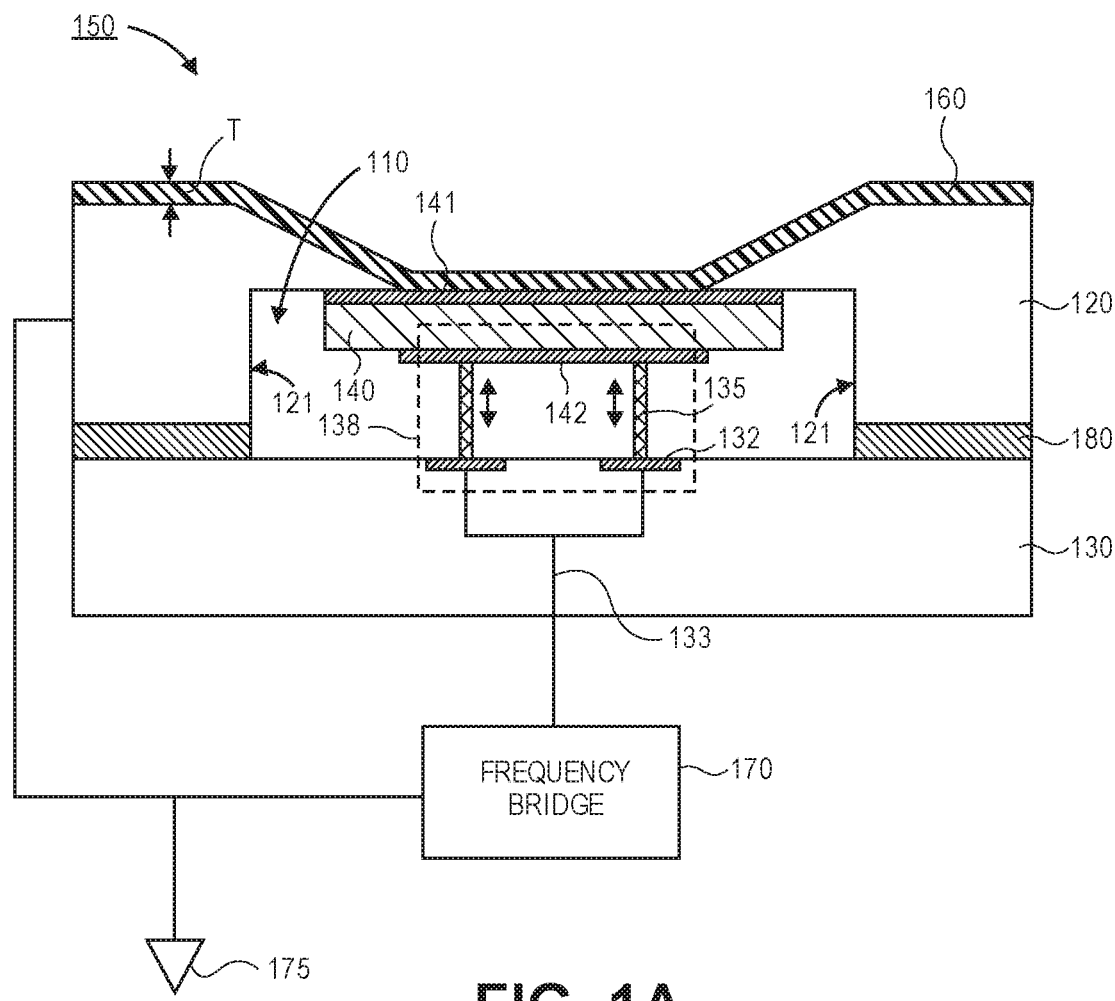
FIG. 1A is cross-sectional illustration of a resonant process monitor with a barrier layer formed over a surface of a first electrode and a frame, in accordance with an embodiment.
Figure 1B:
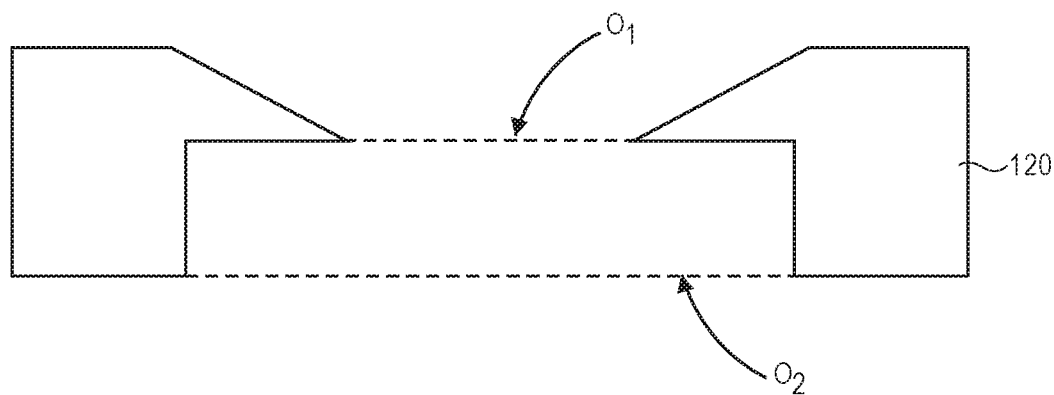
FIG. 1B is a cross-sectional illustration of the frame of the resonant process monitor, in accordance with an embodiment.

Referring now to FIG. 1A, a cross-sectional illustration of a resonant process monitor 150 is shown, according to an embodiment. In an embodiment, the resonant process monitor 150 may include a frame 120. The frame 120 may include a first opening $O_1$ and a second opening $O_2$, as illustrated in FIG. 1B. In an embodiment, the first opening $O_1$ of the frame 120 and the second opening $O_2$ of the frame 120 may have different dimensions, or the dimensions may be substantially similar. In the illustrated embodiment, the first opening $O_1$ and the second opening $O_2$ have substantially similar centerlines, however embodiments are not limited to such configurations. In an embodiment, the frame 120 may be any conductive material. For example, the frame 120 may include one or more of Al, Ti, W, Mo, Si, SiC, stainless steel, alloys thereof, or any other conductor.

Returning now to FIG. 1A, in an embodiment the first opening $O_1$ may be sealed by the resonant body 140. In an embodiment, a first electrode 141 of the resonating body 140 may be in direct contact with surfaces of the frame 120 in order to seal the first opening $O_1$. In an embodiment, the first electrode 141 may be any conductive material. For example, the first electrode 141 may include one or more of Al, Ti, W, Mo, TiN, Si, SiC, Ag, Au, alloys thereof, or any other conductor. The second opening $O_2$ m may be sealed with a back plate 130. In an embodiment, the back plate 130 may be mechanically coupled to the frame 120 with any suitable fastener. For example, the back plate 130 may be secured to the frame 120 with screws or the like (not shown). In an embodiment, the back plate 130 may be electrically isolated from the frame 120. In an embodiment, an O-ring or other gasket 180 may be positioned at the junction between the frame 120 and the back plate 130. As used herein, a "sealed" opening refers to an opening that is covered, and a component that is "sealing" an opening refers to a component that is covering the opening. It is to be appreciated that a "seal" may have different qualities, and embodiments are not limited to any specific quality of seal. For example. in some embodiments described herein a "sealed opening" may be hermetically sealed. Other embodiments may include a "sealed opening" that is not hermetically sealed.

The sealed openings $O_1$ and $O_2$ form a cavity 110 in the resonant process monitor 150. In an embodiment, the cavity 110 may be defined by internal surfaces 121 of the frame 120, the back plate 130, and the first electrode 141 of the resonant body 140. A cavity 110 is beneficial because it reduces or eliminates contamination between the resonant process monitor 150 and the processing chamber. In some embodiments, the cavity 110 may be a hermetically sealed cavity.

In an embodiment, a barrier layer 160 may be formed over surfaces of the frame 120 and the first electrode 141. The barrier layer 160 provides additional protection against cross-contamination between the resonant process monitor 150 and a processing chamber. In an embodiment, the barrier layer 160 is an etch resistant material. As used herein, "etch resistant" refers to a material that is significantly more resistant to an etching chemistry than the layer on a substrate that is desired to be etched. For example, the etch resistant material may be etched at a rate of 1:10 or greater, 1:100 or greater, 1:1,000 or greater, or 1:10,000 or greater. Embodiments may include any suitable material that is etch resistant for the barrier layer 160. For example, the barrier layer 160 may include $Y_2O_3$, $Al_2O_3$, $HfO_2$, $ZrO_2$, $La_2O_3$, or their combinations; or the nitrides of these oxides Y—O—N, Al—O—N, Hf—O—N, Zr—O—N, La—O—N, or their combinations; or the fluorides of these oxides Y—O—F, Al—O—F, Hf—O—F, Zr—O—F, La—O—F, or their combinations; or AN; or a stack of one or more barrier layer materials, or the like. In an embodiment, the barrier layer 160 may be the same material that is used for interior chamber wall coatings. In an embodiment, the barrier layer 160 may be the same material as an edge ring in a processing chamber. In an embodiment, the barrier layer 160 may have a thickness T that is between approximately 10 nm and 200 μm.

In some embodiments, the surfaces of the first electrode 141 and the frame 120 may not be perfectly in direct contact (e.g., surface roughness of the frame 120 and/or the first electrode 141 may not allow for a hermetic seal to be formed between the two surfaces). In such embodiments, the barrier layer 160 improves the seal of the first opening $O_1$. In some embodiments, the barrier layer 160 may provide a hermetic seal of the first opening.

Figure 1C:
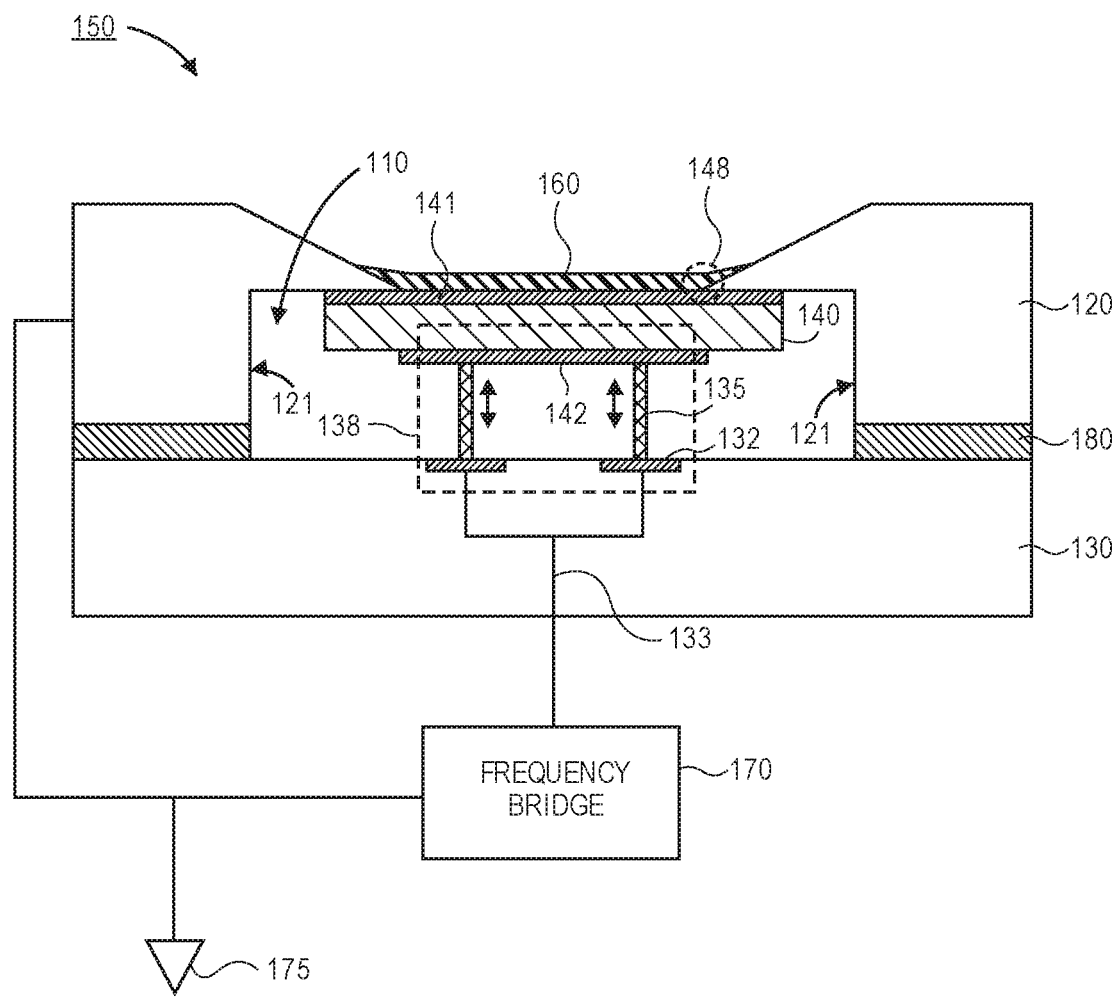
FIG. 1C is a cross-sectional illustration of a resonant process monitor with a barrier layer primarily formed over a surface of a first electrode, in accordance with an embodiment.

In the illustrated embodiment, the barrier layer 160 is formed over an entire upper surface of the frame 120 and over the entire surface of the first electrode 141 exposed by the first opening $O_1$. However it is to be appreciated that the barrier layer 160 does not need to cover the entire surface of the frame 120. For example, FIG. 1C is a cross-sectional illustration where the barrier layer 160 only covers a portion of the frame 120 proximate to the first electrode 141. In some embodiments, the barrier layer 160 may be formed over the entire exposed surface of the first electrode 141 and over the seam 148 where the frame 120 ends and the exposed surface of the first electrode 141 begins. In such embodiments, the barrier layer 160 formed over the seam 148 may be sufficient to ensure a hermetic seal of the first opening $O_1$. In additional embodiments, the barrier layer 160 may be formed only over the first electrode 141 (i.e., the barrier layer 160 does not contact a top surface of the frame 120.

Figure 1D:
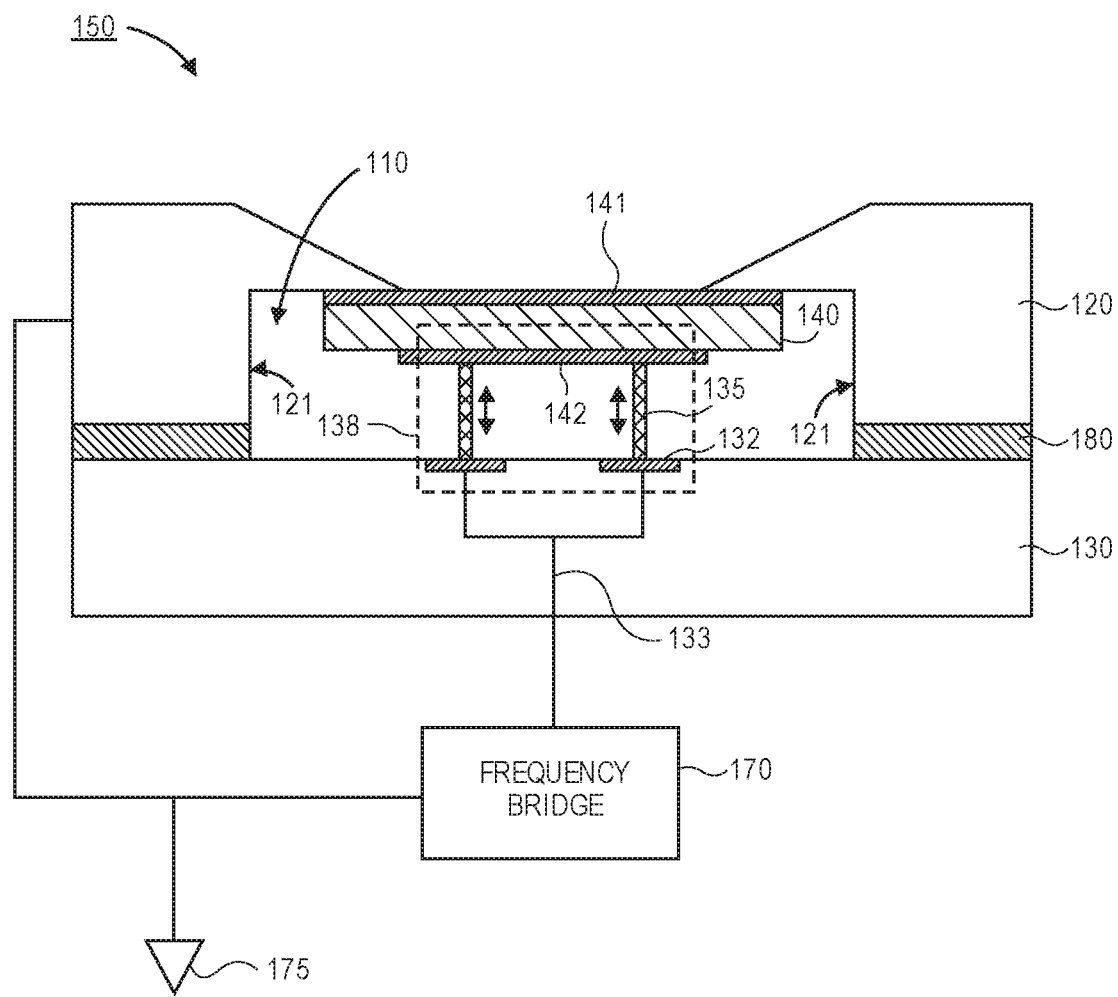
FIG. 1D is a cross-sectional illustration of a resonant process monitor without a barrier layer, in accordance with an embodiment.

In yet another embodiment illustrated in FIG. 1D, the resonant process monitor 150 may be formed without a barrier layer 160. In such embodiment, surfaces of the frame 120 and the first electrode 141 may be exposed. In such an embodiment, the first electrode 141 may also function as a barrier layer to the resonant body 140 (i.e., the first electrode 141 is the only layer covering the top surface of the resonant body 140).

Referring back to FIG. 1A, the resonant body 140 may be disposed between the first electrode 141 and a second electrode 142. The resonant body 140 may be a material that changes resonant frequency as the mass of the resonant body changes. As noted above, a "change to the mass of the resonant body" may refer to changes to the mass of layers supported by the resonant body 140 (e.g., the barrier layer 160 or any other layers (not shown) deposited on the barrier layer 160). In an embodiment, the resonant body 140 may be a piezoelectric material. For example, the resonant body 140 may be quartz, sapphire, semiconducting materials, such as silicon, germanium, or other III-V semiconductor materials, lead zirconate titanate (PZT), or the like.

In an embodiment, the first electrode 141 and the second electrode 142 may be any suitable conductive material. In one embodiment, the first and second electrodes 141 and 142 may include one or more of Al, Ti, W, Mo, TiN, Si, SiC, Ag, Au, alloys thereof, or any other conductor. In the illustrated embodiment, the second electrode 142 does not cover the entire lower surface of the resonant body 140, but it is to be appreciated that embodiments are not limited to such configurations. For example, the second electrode 142 may cover the entire lower surface of the resonant body 140 in some embodiments. The first electrode 141 is illustrated as covering the entire upper surface of the resonant body 140. However, it is to be appreciated that the first electrode 141 need no cover the entire upper surface of the resonant body 140 in some embodiments. Additionally, embodiments may include first and second electrodes 141 and 142 that have different surface areas. For example, the second electrode 142 may have a smaller surface area than the first electrode 141. In yet another embodiment, the surface areas of the first and second electrodes 141 and 142 may be substantially the same.

In an embodiment, a contact assembly 138 may extend from the back plate 130 towards the second electrode 142 of the resonant body 140. A first end of the contact assembly 138 may directly contact the second electrode 142 and a second end of the contact assembly 138 may directly contact the back plate 130. In an embodiment, the contact assembly 138 may include any number of components that provide an electrical connection between the second electrode 142 and the back plate 130. In the illustrated embodiment, a pair of conductive pins 135 are shown as providing the electrical connection. Additional embodiments may include a contact assembly that includes a conductive body, a single conductive body with a plurality of protrusions, or any other electrical connection capable of applying an axial force.

In an embodiment, the back plate 130 is formed of a non-conductive material. In such embodiments, the second end of contact assembly 138 may contact conductive pads 132 of the back plate 130. The conductive pads 132 may be electrically coupled to a frequency bridge 170 by conductive traces and/or wires 133 formed into the back plate. In an embodiment, the conductive traces and/or wires may include a coaxial cable. In such embodiments, the back plate 130 may be at ground potential 175 since the coaxial cable 133 may be electrically isolated from the back plate 130.

In embodiments where the back plate 130 is a conductive material, the conductive pads 132 may be omitted. In such embodiments, a conductive trace or wire may electrically couple the back plate to the frequency bridge 170. In such embodiments, the back plate 130 is electrically isolated from the frame 120. In some embodiments, the gasket 180 may be sufficient to electrically isolate the frame 120 from the back plate 130. However, in additional embodiments one or both of the frame 120 and the back plate 130 may have insulative coatings to provide electrical isolation. In an embodiment, the frame 120 that is electrically coupled to the first electrode 141 may be electrically coupled to the frequency bridge 170. In an embodiment, the frame 120 may be coupled to a ground 175, so that the first electrode is held at a ground potential.

It is to be appreciated that maintaining electrical contact between conductive portions of the back plate 130 and the second electrode is critical to insure proper functioning of the resonant process monitor 150. Accordingly, an axial force (as indicated by the arrows) may be applied by the contact assembly 138. The axial force may be sufficient to maintain contact during operation without fracturing the fragile resonant body 140. In an embodiment, the total axial force may be between approximately 0.1 N and 10.0 N. In an embodiment, the axial force may be approximately 1.0 N.

In some embodiments, the axial force applied by the contact assembly 138 may also insure that proper contact is made between the first electrode 141 and the frame 120. For example, the axial force applied by the contact assembly 138 may be the only external force holding the first electrode 141 in direct contact with the frame 120. In an additional embodiment, the first electrode 141 may be affixed directly to the frame by bonding. For example, some embodiments may include a first electrode that is diffusion bonded to the frame 120. In such embodiments, the first electrode 141 of the resonant body 140 may remain in contact with the frame 120 even if the contact assembly 138 is removed.

Figure 2A:
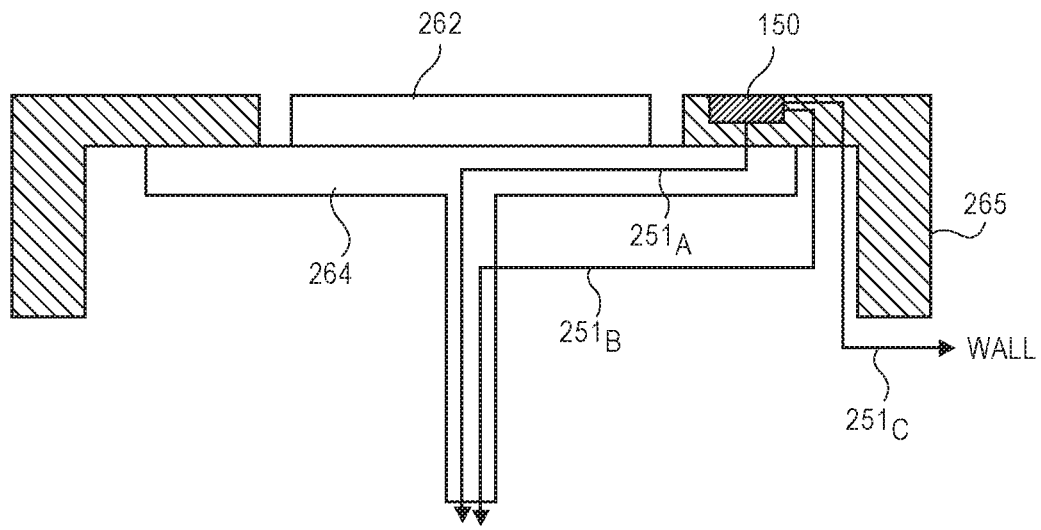
FIG. 2A is a cross-sectional illustration of susceptor and an edge ring that includes a resonant process monitor, in accordance with an embodiment.

Referring now to FIG. 2A, a cross-sectional illustration of a susceptor 264 and an edge ring 265 that includes an integrated resonant process monitor 150 is shown, in accordance with an embodiment. In the illustrated embodiment, the resonant process monitor 150 is shown as a block in order to not obscure the aspects of the embodiment. However, it is to be appreciated that the resonant process monitor 150 may be substantially similar to the resonant process monitors described above with respect to FIGS. 1A and 1B.

In an embodiment, the edge ring 265 may rest on a susceptor 264. The susceptor 264 may be any suitable susceptor used in a processing tool, such as a semiconductor processing tool or the like. The susceptor is shown schematically and it is to be appreciated that additional components may be integrated into the susceptor, as is known in the art. A substrate 262 may be supported by the susceptor 264. The substrate 262 may be any substrate that is being processed in a processing tool, such as a semiconductor substrate, a sapphire substrate, a glass substrate, or the like. In an embodiment, the edge ring 265 may surround the perimeter of the substrate 262.

In an embodiment, the resonant process monitor 150 may be integrated into the edge ring 265. The resonant process monitor 150 may be located proximate to an interior edge of the edge ring 265. In a particular embodiment, an edge of the process monitor 150 may be spaced away from an edge of the substrate 262 a distance D. In an embodiment, the distance D may be less than 300 mm. In an embodiment the distance D may be less than 100 mm. In an embodiment, the distance D may be less than 10 mm.

In an embodiment, the resonant process monitor 150 may be electrically coupled by one or more conductive lines $251_A$ through the susceptor 264 and out of the process chamber (not shown). It is to be appreciated that the one or more conductive lines 251 may include many different exit paths from the chamber. For example, lines $251_A$ are formed entirely in the susceptor 264. In a different embodiment, the lines $251_B$ may be formed outside of the susceptor 264 for at least a portion of its length. In yet another embodiment, the conductive lines may exit the chamber by passing through a wall, as illustrated in lines $251_C$. Accordingly, data from the process monitor 150 may be obtained in real time to provide in situ analysis of the chamber performance.

Particularly, integrating a resonant process monitor 150 into the edge ring 265 allows for the condition of the edge ring to be monitored. For example, a sacrificial layer (not shown) may be formed over the barrier layer that is the same material as the edge ring. Changes to the thickness of the sacrificial layer during processing can be monitored in real time by the resonant process monitor 150. Accordingly, a determination of when the edge ring 265 needs to be replaced (e.g., due to being eroded below a certain threshold) can be made based on information from the resonant process monitor 150.

Figure 2B:
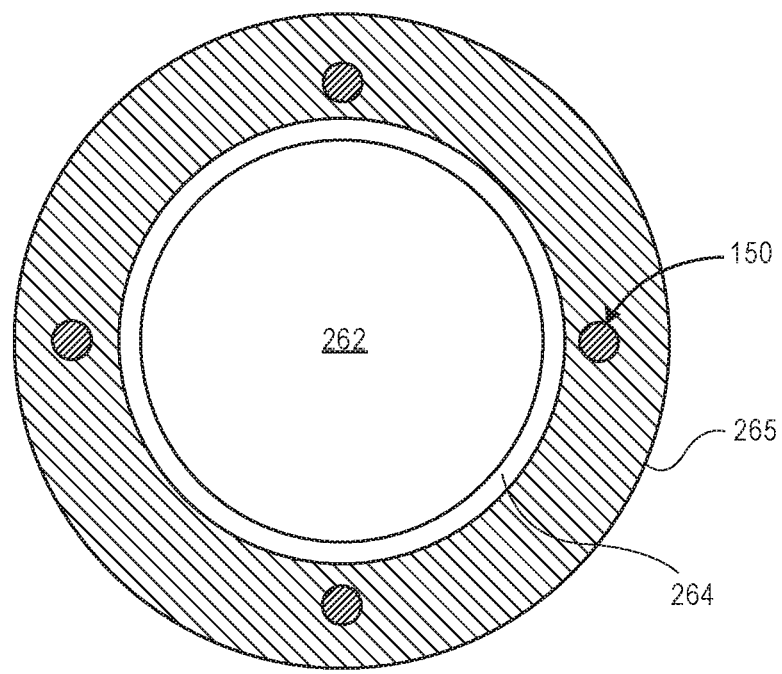
FIG. 2B is a plan view illustration of a susceptor and an edge ring with a plurality of resonant process monitors, in accordance with an embodiment.

Referring now to FIG. 2B, a plan view illustration of the system in FIG. 2A is shown, in accordance with an embodiment. In the illustrated embodiment, four resonant process monitors 150 are integrated into the edge ring 265. However, it is to be appreciated that any number of resonant process monitors 150 (e.g., one or more) may be integrated into the edge ring 265.

Figure 3:
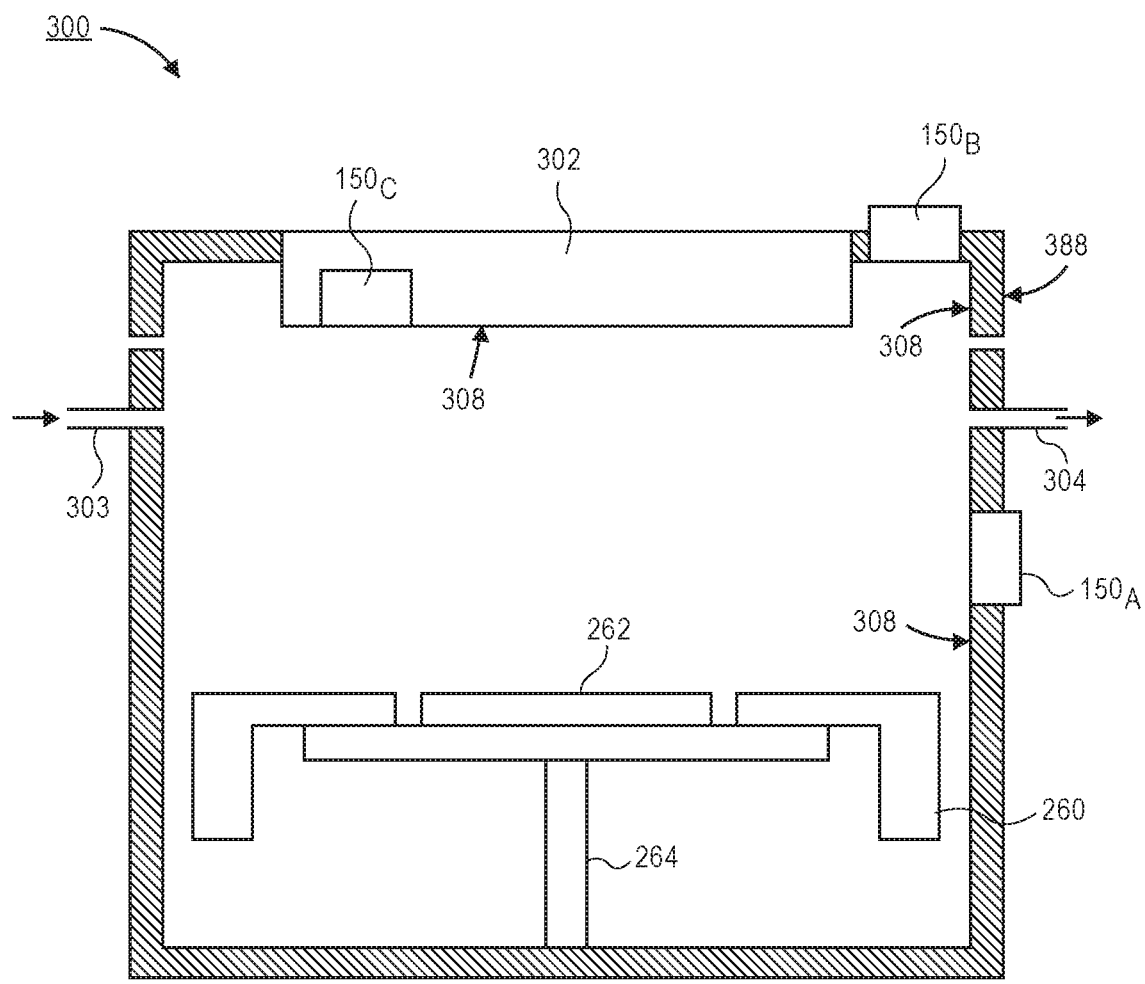
FIG. 3 is a schematic illustration of a processing tool that includes a resonant process monitor integrated into a sidewall of the chamber, in accordance with an embodiment.
Figure 4:
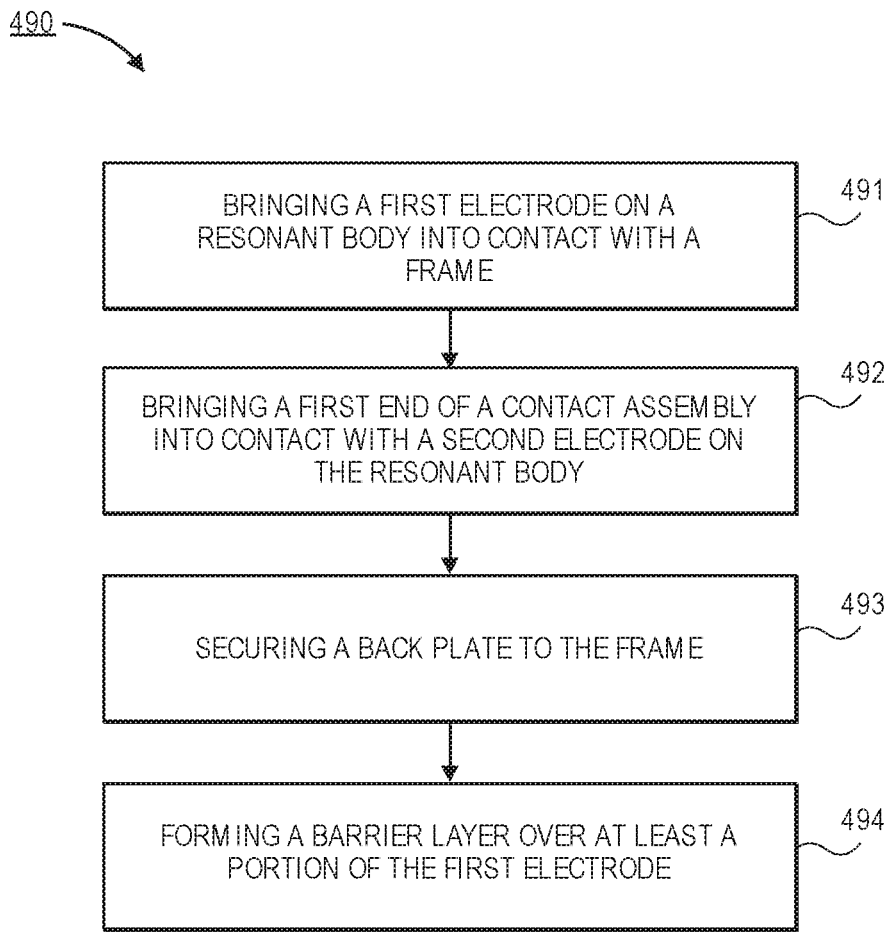
FIG. 4 is a process flow diagram of a process for fabricating a resonant process monitor, in accordance with an embodiment.

Referring now to FIG. 3, a cross-sectional illustration of a processing tool 300 with integrated resonant process monitors 150 is shown, in accordance with an embodiment. In an embodiment, one or more processing gasses may be flown into a chamber 307 through gas/vent ports 303/304. The processing gasses may be ionized with a power source (e.g., a radio-frequency or microwave-frequency source) that is coupled to an applicator 302 to form a plasma 306. In an embodiment, the applicator 302 may be a component of the lid 388 of the chamber. The plasma 306 may interact with a surface of a substrate 262 positioned on a susceptor 264. In an embodiment, an edge ring 265 may surround the substrate 262. Though not illustrated in FIG. 3, it is to be appreciated that tool 300 may include a resonant process monitor 150 integrated into the edge ring 265, similar to the edge ring described in FIG. 2A. It is to be appreciated that process tool 300 illustrated in FIG. 3 is exemplary in nature and highly simplified by removing components known to those skilled in the art (e.g., vacuum pumps, heating elements, electrical components, among others) in order to not obscure aspects of various embodiments.

In an embodiment, the resonant process monitor 150 may be oriented so that the face of the first electrode is directed out from a wall 308 of the chamber 300. As used herein, a wall 308 of the chamber 300 may refer to sidewalls, surfaces of the lid 388, and surfaces of the applicator 302. For example, a resonant process monitor $150_A$ may be positioned along a side wall 308 of the chamber 300, a resonant process monitor $150_B$ may be positioned along a lid wall 308 of the chamber 300, or a resonant process monitor $150_C$ may be positioned along an applicator wall 308 of the process chamber 300. In an embodiment, the resonant process monitor 150 forms a portion of the wall 308 of the chamber 300. For example, the frame 120 and/or the back plate 130 may form a portion of the wall 308 of the chamber 300. In an embodiment, the barrier layer 160 of the resonant process monitor 150 may be the same material used to coat the interior wall 308 of the chamber 300. As such, changes to the interior surface coating may be monitored in real time.

Figure 5A:
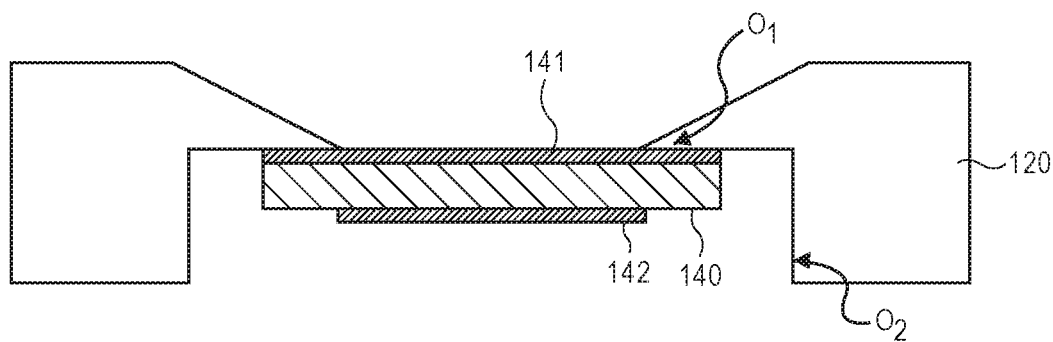
FIG. 5A is a cross-sectional illustration of the resonant body being attached to the frame, in accordance with an embodiment.

Referring now to FIG. 4 and FIG. 5A-5C, a process flow diagram of a process 490 for fabricating a resonant process monitor 150 is shown, in accordance with an embodiment. Referring now to operation 491, process 490 may include bringing a first electrode on a resonant body 140 into contact with a frame 120, as shown in FIG. 5A. In an embodiment, the first electrode 141 of the resonant body seals a first opening $O_1$ in the frame 120. In an embodiment, the first electrode 141 may be bonded to the frame 120. For example, the first electrode 141 may be diffusion bonded to the frame 120. In some embodiments, the first electrode 141 may hermetically seal the first opening $O_1$.

Figure 5B:
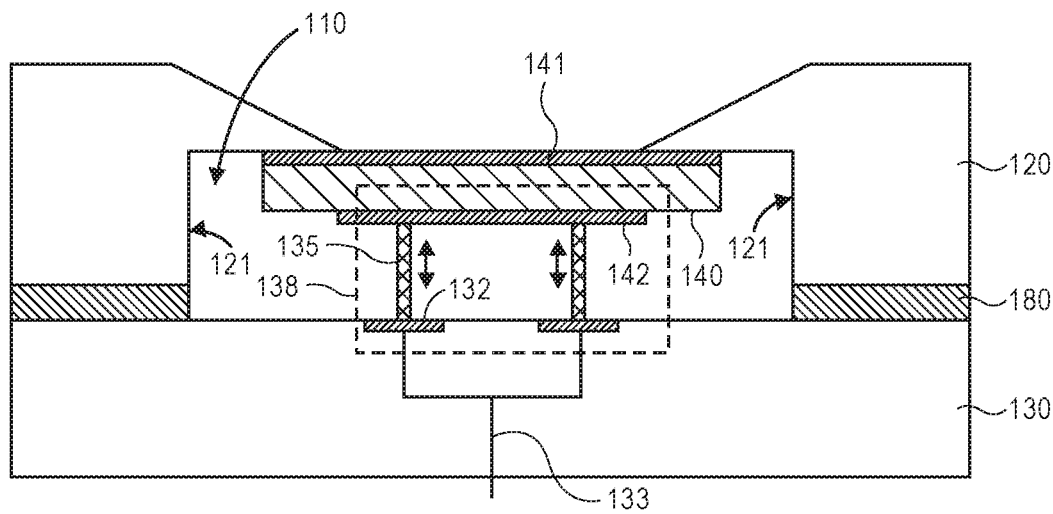
FIG. 5B is a cross-sectional illustration of a contact assembly being brought into contact with the second electrode and the frame being secured to the back plate, in accordance with an embodiment.

Referring now to operation 492, process 490 may include bringing a first end of a contact assembly 138 into contact with a second electrode 142 on the resonant body 140, as shown in FIG. 5B. In an embodiment, a second end of the contact assembly 138 is supported by a back plate 130. In an embodiment, the contact assembly may apply an axial force onto the resonant body 140, as shown by the arrows. For example, the axial force may be between approximately 0.1 N and 10.0 N.

Referring now to operation 493, process 490 may include with securing the back plate 130 to the frame 120. In an embodiment, the frame 120 may be secured to the back plate 130 with fasteners (not shown), such as screws or the like. In an embodiment, the back plate 130 seals a second opening $O_2$ in the frame 120. In an embodiment, a gasket or an O-ring may separate the back plate 130 and the frame 120. In an embodiment, the frame 120 is electrically isolated from the back plate 130. In an embodiment, a cavity 110 is defined by the first electrode 141, the back plate 130, and interior surfaces 121 of the frame 120. In an embodiment, the cavity 110 is a hermetically sealed cavity.

Figure 5C:
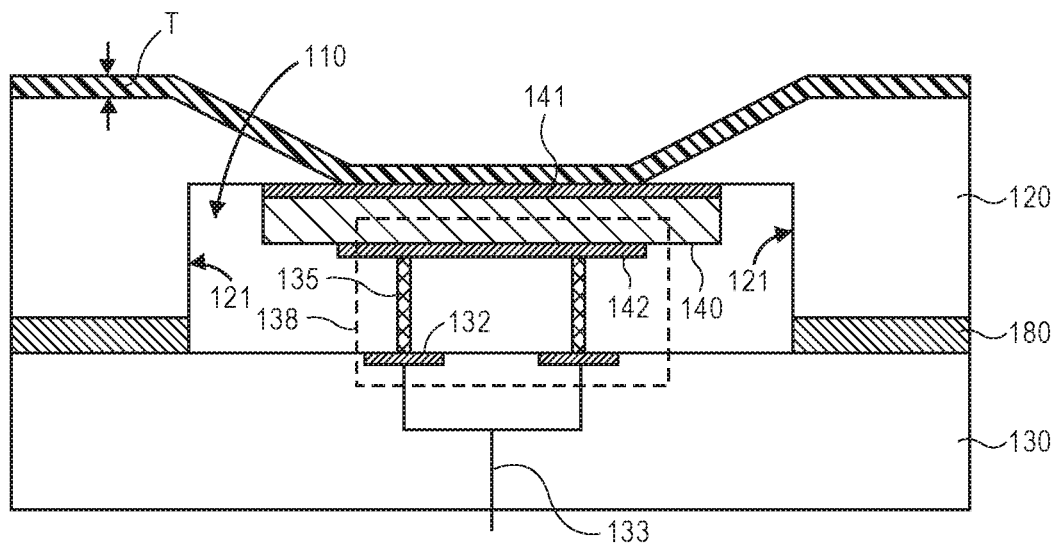
FIG. 5C is a cross-sectional illustration after the barrier layer is formed over the resonant process monitor, in accordance with an embodiment.

Referring now to operation 494, process 490 may include forming a barrier layer 160 over at least a portion of the first electrode 141 as shown in FIG. 5C. In an embodiment, the barrier layer 160 is formed over the first electrode 141 and a surface of the frame 120. In an embodiment, the barrier layer 160 hermetically seals the first opening $O_1$. In an embodiment, the barrier layer 160 is an etch resistant material. For example, the barrier layer 160 may include $Y_2O_3$, $Al_2O_3$, $HfO_2$, $ZrO_2$, $La_2O_3$, or their combinations; or the nitrides of these oxides Y—O—N, Al—O—N, Hf—O—N, Zr—O—N, La—O—N, or their combinations; or the fluorides of these oxides Y—O—F, Al—O—F, Hf—O—F, Zr—O—F, La—O—F, or their combinations; or AlN; or a stack of one or more barrier layer materials, or the like. In an embodiment, the barrier layer 160 is formed with any suitable deposition process, such as sputtering, ALD, plasma enhanced ALD (PEALD), CVD, plasma enhanced CVD (PECVD), evaporation, sputtering, plasma arc coating, aerosol coating, or combinations of more than one process. In an embodiment, the barrier layer 160 may be between approximately 10 nm and 200 µm. In an embodiment, the deposition process is implemented at a temperature that is less than 200° C. In an embodiment, the deposition process is implemented at a temperature less than 150° C.

Figure 6:
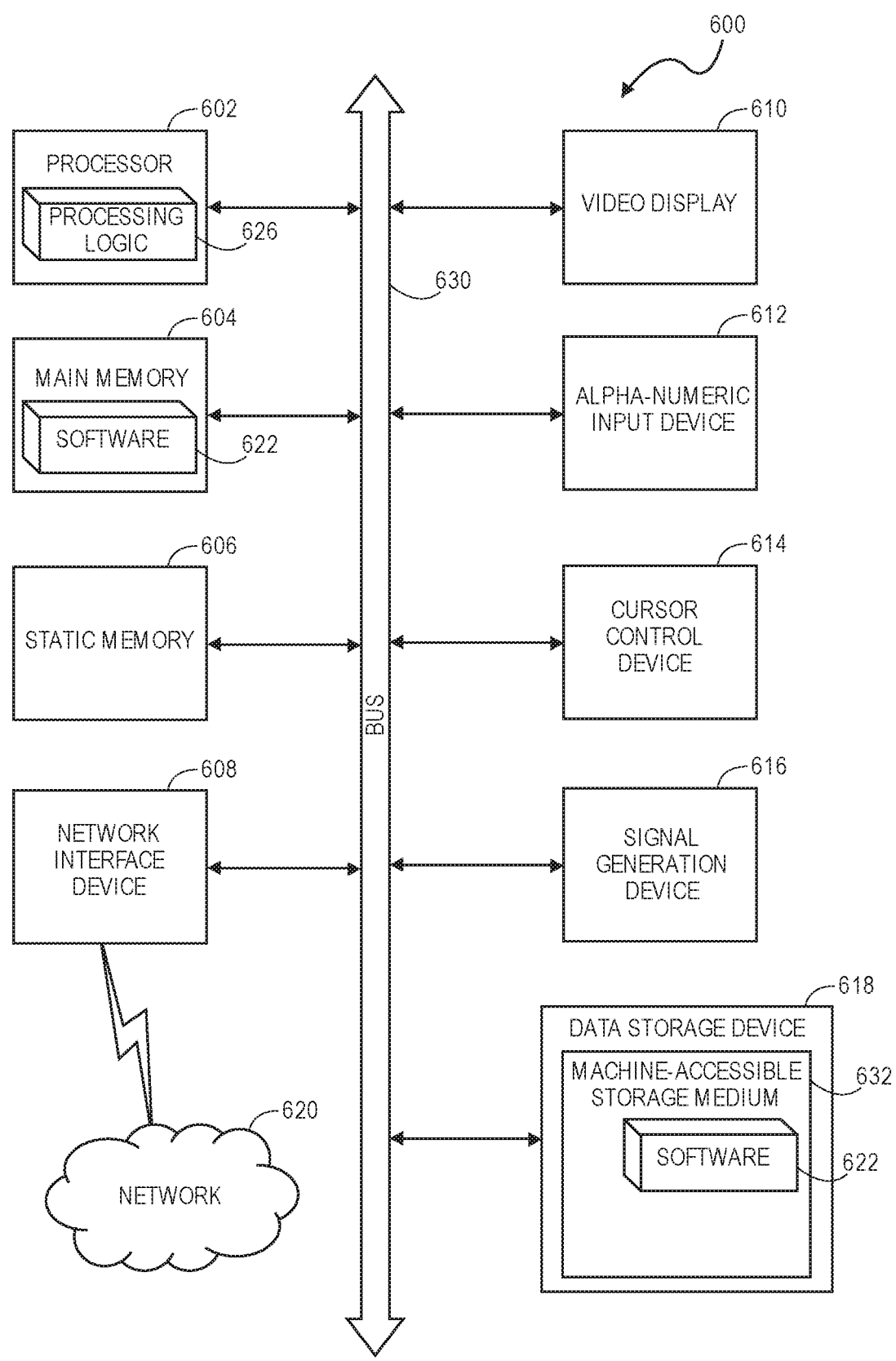
FIG. 6 illustrates a block diagram of an exemplary computer system that may be used in conjunction with processes that include monitoring the etch rate of a radical only etching process in real time, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool. Computer system 660 may be connected (e.g., networked) to other machines in a Local Area Network (LAN), an intranet, an extranet, or the Internet. Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM") magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 620 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A processing tool, comprising:
   a chamber;
   a susceptor;
   an edge ring around the susceptor; and
   a resonant process monitor comprising:
     a frame, wherein the frame comprises a first opening and a second opening;
     a resonant body sealing the first opening of the frame, wherein a first electrode on a first surface of the resonant body contacts the frame, and wherein a second electrode is on a second surface of the resonant body, and wherein only the second electrode contacts the second surface of the resonant body; and
     a back plate sealing the second opening of the frame, wherein the back plate is mechanically coupled to the frame and electrically isolated from the frame, wherein the resonant body, the back plate, and interior surfaces of the frame define a gas-filled cavity below the resonant body, and wherein the second electrode and a portion of the second surface of the resonant body and side surfaces of the resonant body are exposed to the gas-filled cavity.

2. The processing tool of claim 1, wherein the resonant process monitor further comprises a barrier layer on at least a portion of the first electrode.

3. The processing tool of claim 1, wherein the resonant process monitor is integrated into the edge ring.

4. The processing tool of claim 1, wherein the resonant process monitor is integrated into a wall of the chamber.

5. A resonant process monitor, comprising:
   a frame, wherein the frame comprises a first opening and a second opening;
   a resonant body sealing the first opening of the frame, wherein a first electrode on a first surface of the resonant body contacts the frame, and wherein a second electrode is on a second surface of the resonant body, and wherein only the second electrode contacts the second surface of the resonant body; and a back plate sealing the second opening of the frame, wherein the back plate is mechanically coupled to the frame and electrically isolated from the frame, wherein the resonant body, the back plate, and interior surfaces of the frame define a gas-filled cavity below the resonant body, and wherein the second electrode and a portion of the second surface of the resonant body and side surfaces of the resonant body are exposed to the gas-filled cavity.

6. The resonant process monitor of claim 5, further comprising a barrier layer on at least a portion of the first electrode, and wherein the barrier layer is an etch resistant coating.

7. The resonant process monitor of claim 6, wherein the barrier layer comprises a barrier layer material or a stack of two or more barrier layer materials, wherein the barrier layer materials comprise one or more of $Y_2O_3$, $Al_2O_3$, $HfO_2$, $ZrO_2$, $La_2O_3$, or their combinations; or the nitrides of Y—O—N, Al—O—N, Hf—O—N, Zr—O—N, La—O—N, or their combinations; or the fluorides of Y—O—F, Al—O—F, Hf—O—F, Zr—O—F, La—O—F, or their combinations; or AlN.

8. The resonant process monitor of claim 6, wherein the barrier layer covers the entire portion of the first electrode visible through the first opening of the frame.

9. The resonant process monitor of claim 8, wherein the barrier layer is formed over portions of the frame.

10. The resonant process monitor of claim 6, wherein the barrier layer has a thickness less than 200 μm.

11. The resonant process monitor of claim 5, wherein the gas-filled cavity is hermetically sealed.

12. The resonant process monitor of claim 5, further comprising:

a contact assembly extending from the back plate to the second electrode, wherein an axial force along the contact assembly is applied to the second electrode.

13. The resonant process monitor of claim 12, wherein the axial force is less than 10 N.

14. The resonant process monitor of claim 12, wherein the axial force secures the first electrode against the frame.

15. The resonant process monitor of claim 5, wherein the first electrode is diffusion bonded to the frame.

16. The resonant process monitor of claim 5, wherein the resonant body is one of quartz, sapphire, silicon, germanium, or lead zirconate titanate.

17. The resonant process monitor of claim 5, further comprising:

a frequency bridge electrically coupled between the first electrode and the second electrode, and wherein the first electrode is electrically coupled to a ground potential.

18. A method of forming a resonant process monitor, comprising:

bringing a first electrode on a first surface of a resonant body into contact with a frame, wherein the resonant body seals a first opening in the frame;

bringing a first end of a contact assembly into contact with a second electrode on a second surface of the resonant body, wherein only the second electrode contacts the second surface of the resonant body, wherein a second end of the contact assembly is supported by a back plate;

securing the back plate to the frame, wherein the back plate seals a second opening in the frame and the back plate is electrically isolated from the frame, and wherein the resonant body, the back plate, and interior sidewalls of the frame define a gas-filled cavity below the resonant body, and wherein the second electrode and a portion of the second surface of the resonant body and side surfaces of the resonant body are exposed to the gas-filled cavity; and forming a barrier layer over at least a portion of the first electrode.

19. The method of claim 18, further comprising:

bonding the first electrode to the frame.

20. The method of claim 18, wherein the barrier layer is formed with sputtering, ALD, plasma enhanced ALD (PEALD), CVD, plasma enhanced CVD (PECVD), evaporation, sputtering, plasma arc coating, aerosol coating, or combinations of more than one process.

* * * * *

UNITED STATES PATENT AND TRADEMARK OFFICE
CERTIFICATE OF CORRECTION

| | |
|---|---|
| PATENT NO. | : 11,551,905 B2 |
| APPLICATION NO. | : 15/925739 |
| DATED | : January 10, 2023 |
| INVENTOR(S) | : Pan et al. |

It is certified that error appears in the above-identified patent and that said Letters Patent is hereby corrected as shown below:

On the Title Page

In item (73) the Assignee section:
Delete "Intel Corporation" and insert -- Applied Materials, Inc. --

Signed and Sealed this
Twenty-first Day of March, 2023

Katherine Kelly Vidal
*Director of the United States Patent and Trademark Office*